US011348815B2

(12) United States Patent
Sato

(10) Patent No.: US 11,348,815 B2
(45) Date of Patent: May 31, 2022

(54) BOARD STORING CONTAINER

(71) Applicant: MIRAIAL CO., LTD., Tokyo (JP)

(72) Inventor: Kyohei Sato, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 337 days.

(21) Appl. No.: 16/500,048

(22) PCT Filed: Apr. 6, 2017

(86) PCT No.: PCT/JP2017/014356
§ 371 (c)(1),
(2) Date: Oct. 1, 2019

(87) PCT Pub. No.: WO2018/185906
PCT Pub. Date: Oct. 11, 2018

(65) Prior Publication Data
US 2020/0286749 A1    Sep. 10, 2020

(51) Int. Cl.
*H01L 21/67*    (2006.01)
*H01L 21/673*    (2006.01)

(52) U.S. Cl.
CPC .................................. *H01L 21/673* (2013.01)

(58) Field of Classification Search
CPC ............ H01L 21/673; H01L 21/67369; H01L 21/67383; H01L 21/67373; H01L 21/6732; H01L 21/67346; H01L 21/67379
See application file for complete search history.

(56) References Cited

U.S. PATENT DOCUMENTS 6,267,245 B1    7/2001  Bores et al.
11,211,275 B2 *  12/2021  Ogawa .............. H01L 21/67376
(Continued)

FOREIGN PATENT DOCUMENTS

JP    2003-522078 A    7/2003
JP    2005-191021 A    7/2005
(Continued)

*Primary Examiner* — Mohammed Shamsuzzaman
(74) *Attorney, Agent, or Firm* — Muncy, Geissler, Olds & Lowe, PC

(57) ABSTRACT

This board storing container is provided with a container body, a lid 3, and a lid-side board support unit 7 which, when the lid 3 closes a container body opening, is arranged in the part of the lid 3 opposite of the board storage space and which can support the edge of multiple boards. The lid-side board support unit 7 is provided with a lid-side board receiving unit which receives the edge of a board when supporting the board, and a frame part 71 held on the inner surface of the lid 3 and having a first surface 711 facing the inner surface of the lid 3 and a second surface 712 opposite of the first surface 711. The lid 3 is provided with a frame holding unit 35 for holding the frame 71 in an inserted state, and comprises a third surface 353 opposite of the first surface 711 and a fourth surface 354 opposite of the second surface 712. The lid-side board support unit 7 further is provided with a first protrusion 76 which, on the first surface 711 of the frame part 71, protrudes towards the third surface 353, and is provided with an engagement part 75 which, on the second surface 712 of the frame part 71, engages with the frame holding unit 35 in a state in which the frame part 71 is inserted.

3 Claims, 17 Drawing Sheets

(56) References Cited

U.S. PATENT DOCUMENTS

| | | | |
|---|---|---|---|
| 11,230,427 B2* | 1/2022 | Ogawa | B65D 85/30 |
| 2002/0005369 A1* | 1/2002 | Nyseth | H01L 21/67376 |
| | | | 211/41.18 |
| 2005/0115865 A1 | 6/2005 | Matsutori et al. | |
| 2007/0175792 A1* | 8/2007 | Gregerson | H01L 21/67376 |
| | | | 206/711 |
| 2008/0136879 A1* | 6/2008 | Sakai | B41J 2/1752 |
| | | | 347/86 |
| 2010/0258475 A1 | 10/2010 | Ogawa | |
| 2013/0319907 A1* | 12/2013 | Gregerson | H01L 21/67373 |
| | | | 206/711 |
| 2015/0041353 A1 | 2/2015 | Adams et al. | |
| 2015/0122699 A1* | 5/2015 | Gregerson | F16J 15/104 |
| | | | 206/711 |
| 2015/0318195 A1* | 11/2015 | Ohnuki | B65D 43/22 |
| | | | 206/710 |
| 2020/0043755 A1* | 2/2020 | Kai | H01L 21/67379 |
| 2020/0373180 A1* | 11/2020 | Toda | H01L 21/67366 |

FOREIGN PATENT DOCUMENTS

| | | |
|---|---|---|
| JP | 4213078 B2 | 1/2009 |
| JP | 2009-124063 A | 6/2009 |
| JP | 2012004380 A | 1/2012 |
| JP | 5253410 B2 | 4/2013 |
| KR | 10-2014-0054205 | 5/2014 |
| WO | WO 2000/002798 A1 | 1/2000 |

* cited by examiner

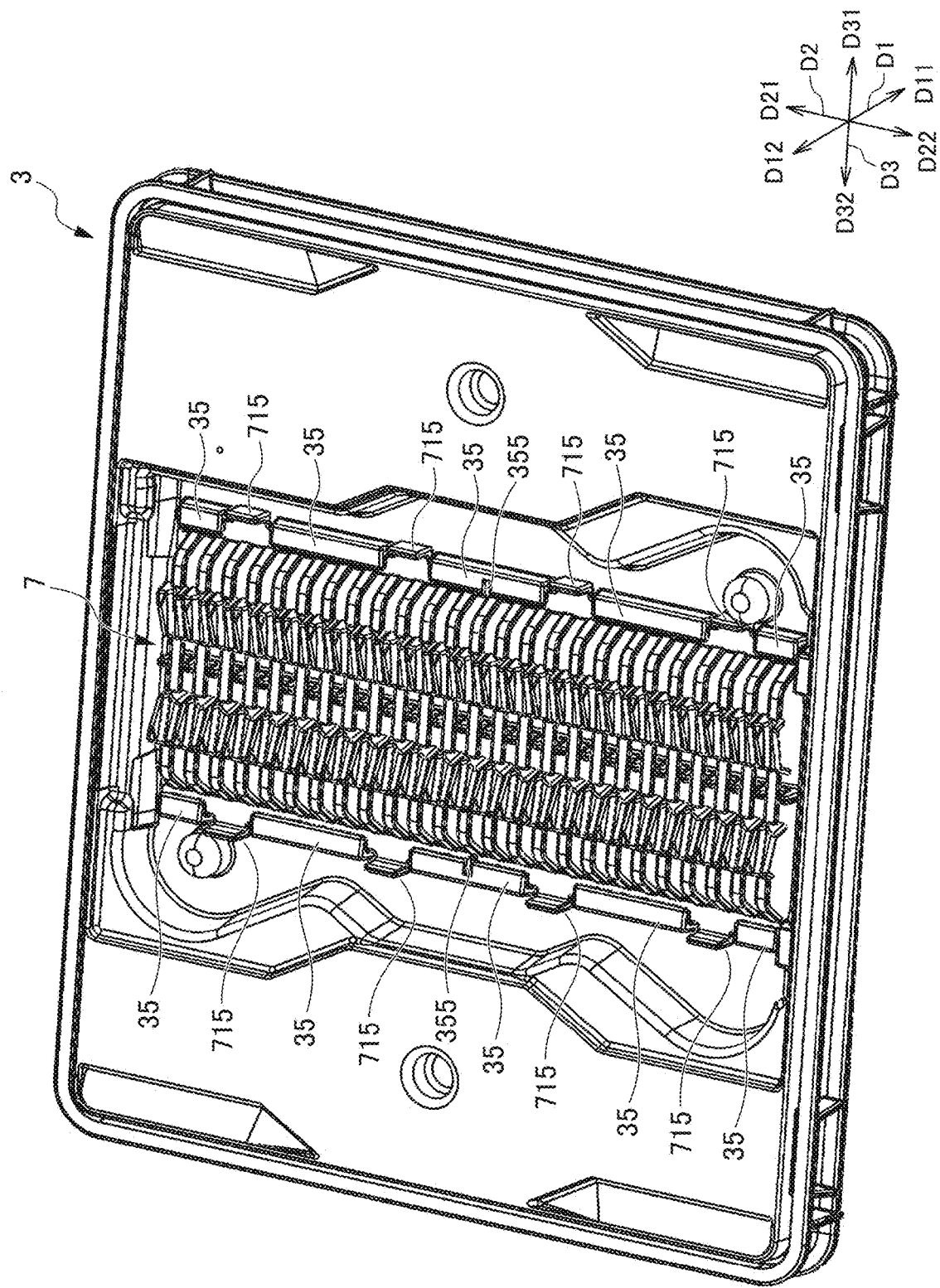

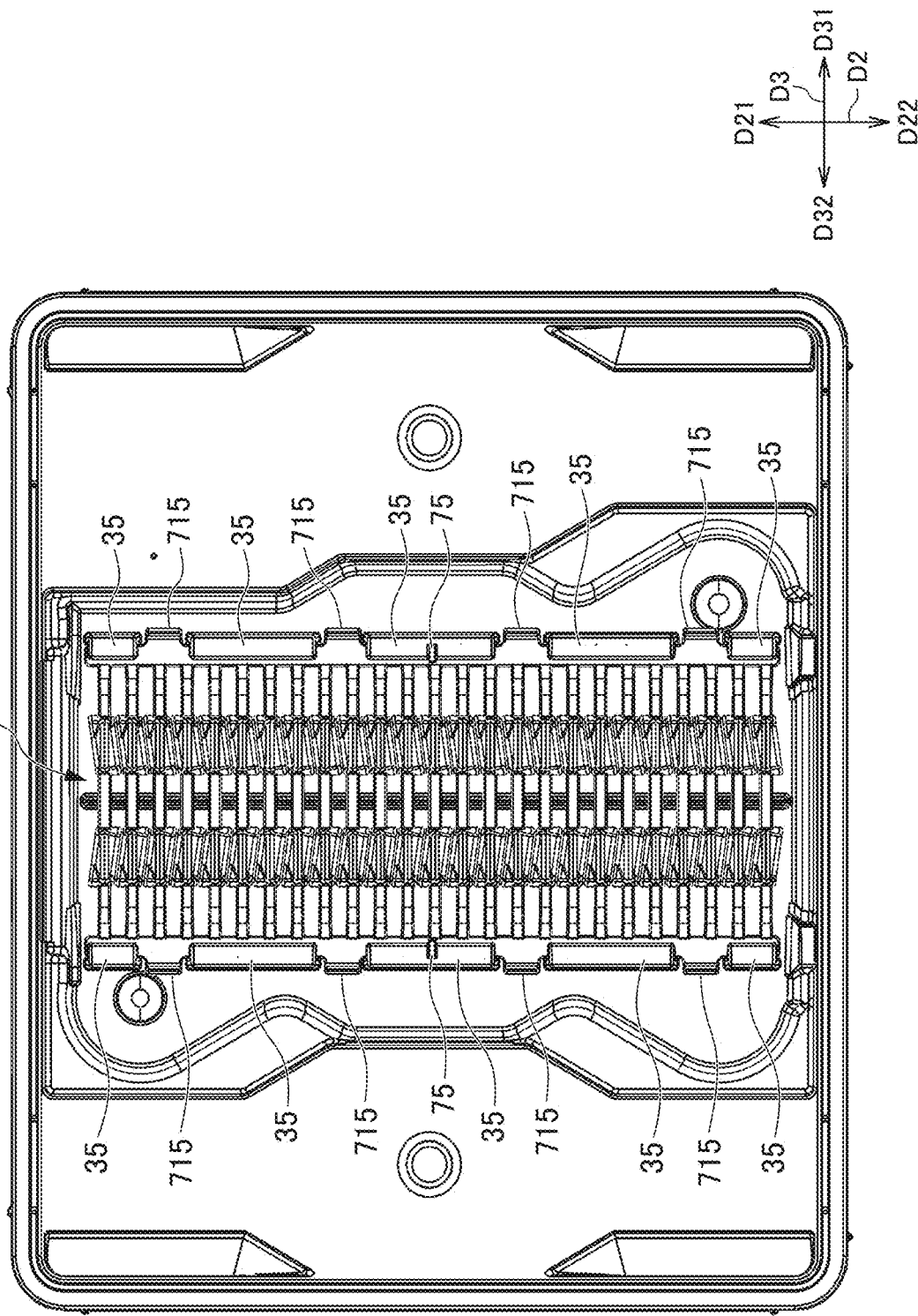

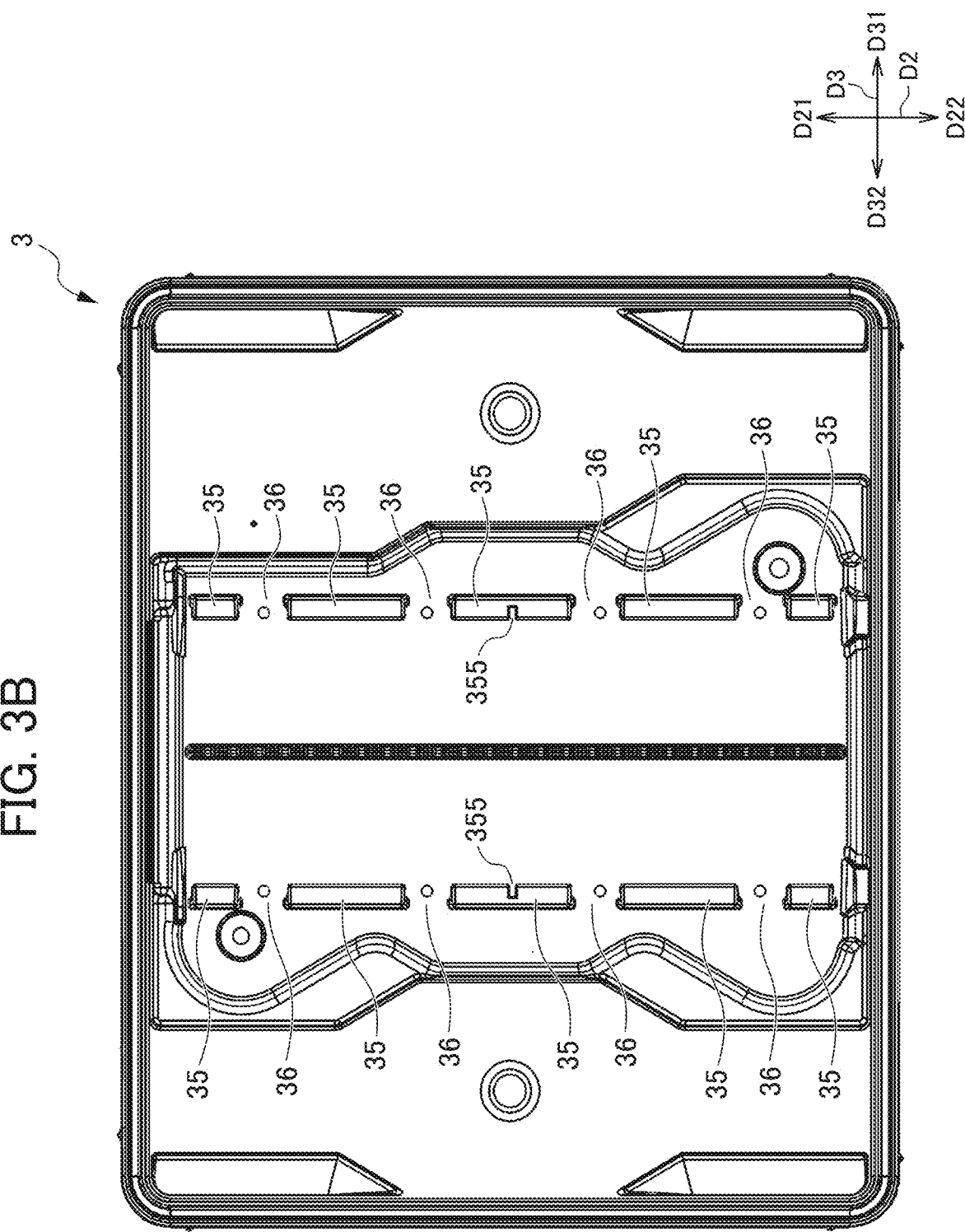

FIG. 6B
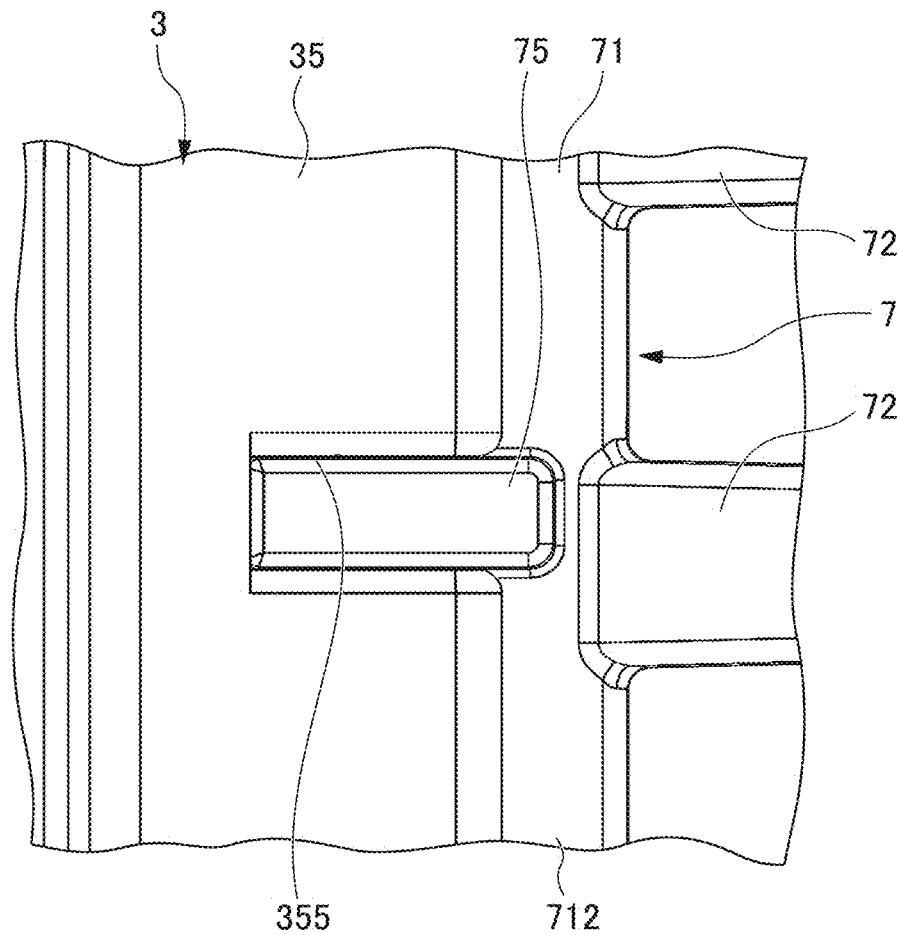
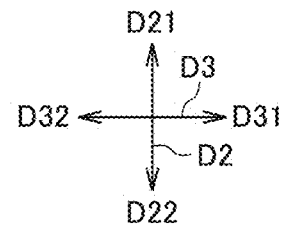

BOARD STORING CONTAINER

TECHNICAL FIELD

The present invention relates to a substrate storing container, particularly to a substrate storing container that stores a plurality of substrates such as semiconductor wafers in a state where the plurality of substrates are arranged parallel to each other.

BACKGROUND ART

As a substrate storing container that stores substrates such as semiconductor wafers, there has been known a substrate storing container configured to include a container main body and a lid body. The container main body has a tubular wall portion in which a container main body opening portion is formed in one end portion and the other end portion is closed. A substrate storing space is formed inside the container main body. The substrate storing space is formed surrounded by the wall portion, and is capable of storing a plurality of substrates. The container main body includes a back side substrate support portion on a back side of the substrate storing space.

The lid body is removably attached to the container main body opening portion, and when the lid body is installed at the container main body opening portion, the lid body closes the container main body opening portion. The lid body includes a lid body side substrate support portion (referred to also as a "front retainer") on an inside thereof facing the substrate storing space of the container main body when the lid body is installed at the container main body opening portion. When the lid body is installed at the container main body opening portion, the front retainer supports the plurality of substrates in cooperation with the back side substrate support portion of the container main body. The front retainer includes a substrate receiving portion; a frame portion; and a leg portion that connects the substrate receiving portion to the frame portion so as to retain the substrate receiving portion at a position spaced apart by a predetermined interval from an inner face of the lid body. The lid body further includes a frame portion retaining portion on the inside thereof, into which the frame portion is inserted and by which the frame portion (by extension, the entire front retainer) is retained (refer to Patent Document 1).

Patent Document 1: Japanese Unexamined Patent Application, Publication No. 2012-004380

DISCLOSURE OF THE INVENTION

Problems to be Solved by the Invention

In the technique described in Patent Document 1, opposite faces of the frame portion and the frame portion retaining portion are in substantially face contact with each other in a part of the frame portion retaining portion, into which the frame portion is inserted. For this reason, a gap between the opposite faces tends to be very small, and thus it is difficult for a cleaning liquid (containing a rinsing liquid) to infiltrate between the opposite faces, and it is difficult for the cleaning liquid to escape from between the opposite faces. As a result, problems such as insufficient cleaning power, remaining cleaning liquid, and insufficient drying occur easily between the opposite faces.

An object of the present invention is to provide a substrate storing container in which it is difficult for problems such as insufficient cleaning power, remaining cleaning liquid, and insufficient drying to occur between opposite faces of a frame portion of a lid body side substrate support portion and a frame portion retaining portion of a lid body into which the frame portion is inserted.

Means for Solving the Problems

The present invention relates to a substrate storing container including a container main body which includes a tubular wall portion which has an opening circumferential portion in which a container main body opening portion is formed in one end portion and in which the other end portion is closed, and in which a substrate storing space capable of storing a plurality of substrates and communicating with the container main body opening portion is formed by an inner face of the wall portion; a lid body removably attached to the container main body opening portion and capable of closing the container main body opening portion; a lid body side substrate support portion disposed in a part of the lid body facing the substrate storing space, and capable of supporting edge portions of the plurality of substrates when the container main body opening portion is closed by the lid body; and a back side substrate support portion disposed so as to form a pair with the lid body side substrate support portion in the substrate storing space, capable of supporting edge portions of the plurality of substrates, and capable of supporting the plurality of substrates in cooperation with the lid body side substrate support portion when the container main body opening portion is closed by the lid body. The lid body side substrate support portion includes a lid body side substrate receiving portion which receives the edge portion of the substrate when supporting the substrate, and a frame portion retained on an inner face side of the lid body and having a first face facing the inner face side of the lid body and a second face which is a face opposite to the first face. The lid body includes a frame portion retaining portion which retains the frame portion in an inserted state, and has a third face facing the first face and a fourth face facing the second face. The lid body side substrate support portion further includes a first convex portion projecting to the third face on the first face side of the frame portion, and an engaging portion which engages with the frame portion retaining portion on the second face side of the frame portion in a state where the frame portion is inserted.

In addition, the lid body side substrate support portion may further include a second convex portion projecting to the fourth face on the second face of the frame portion.

In addition, the first convex portion and/or the second convex portion may extend along a planar direction of the substrate.

In addition, the first convex portion and/or the second convex portion may extend along an arrangement direction of the plurality of substrates.

In addition, the first convex portion or the second convex portion may have a shape in which the first convex portion or the second convex portion can be in point contact with the third face or the fourth face opposite thereto.

Effects of the Invention

According to the present invention, it is possible to provide the substrate storing container in which it is difficult for problems such as insufficient cleaning power, remaining cleaning liquid, and insufficient drying to occur between the opposite faces of the frame portion of the lid body side substrate support portion and the frame portion retaining portion of the lid body into which the frame portion is inserted.

BRIEF DESCRIPTION OF THE DRAWINGS

FIG. 2A is a perspective view of the lid body 3 according to the first embodiment of the present invention as seen from inside.

FIG. 2B is a back view of the lid body 3 according to the first embodiment of the present invention as seen from inside.

FIG. 3B is a back view of the lid body 3 according to the first embodiment of the present invention from which the front retainer 7 is removed, as seen from inside.

FIG. 6B is an enlarged back view of the part in which the engaging portion 75 of the front retainer 7 engages with the frame portion retaining portion 35 of the lid body 3 in the substrate storing container 1 according to the first embodiment of the present invention.

PREFERRED MODE FOR CARRYING OUT THE INVENTION

First Embodiment

Figure 1:
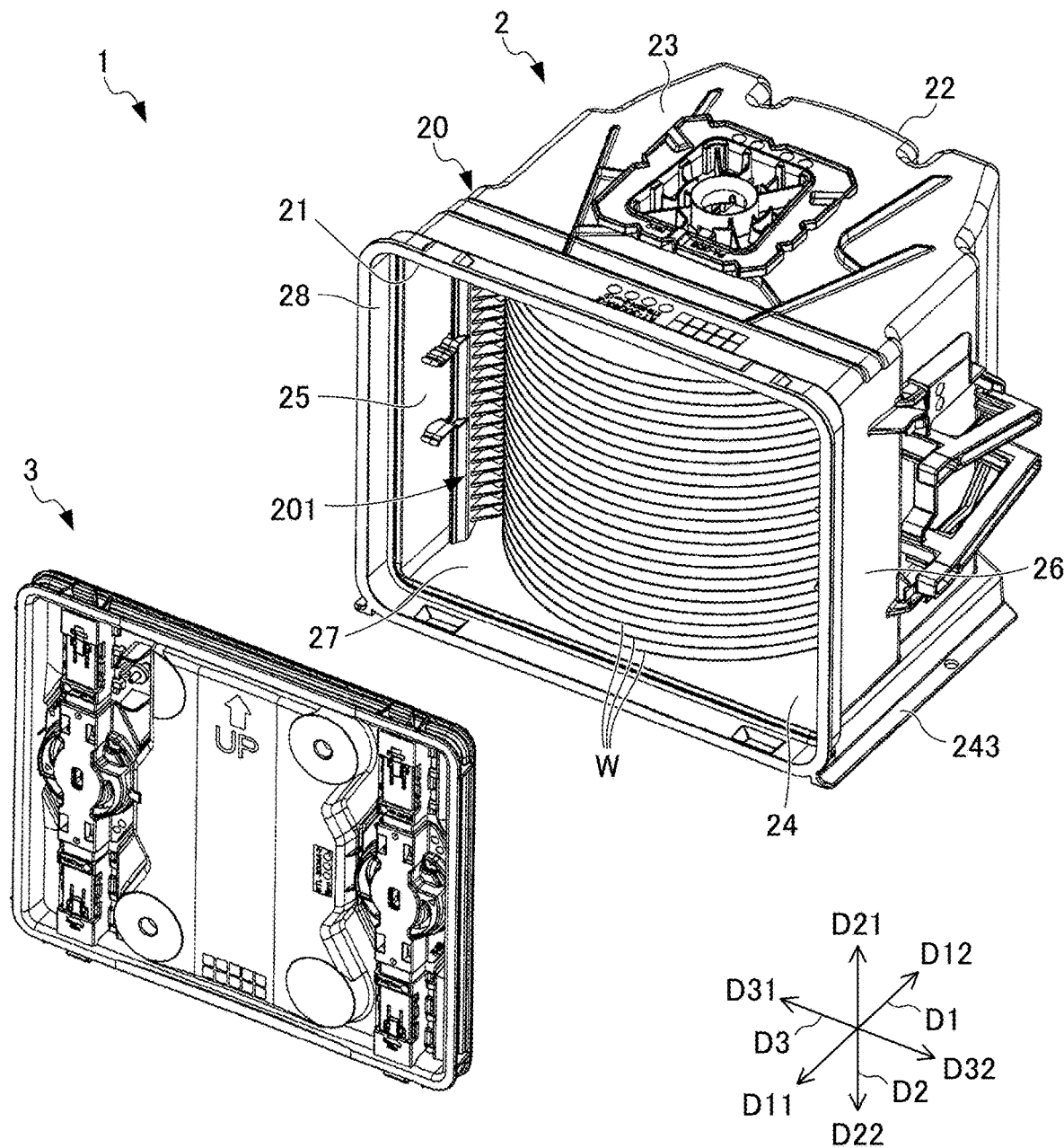
FIG. 1 is a perspective view illustrating a state where a lid body 3 is removed from a container main body 2 in a substrate storing container 1 according to a first embodiment of the present invention.
Figure 3A:
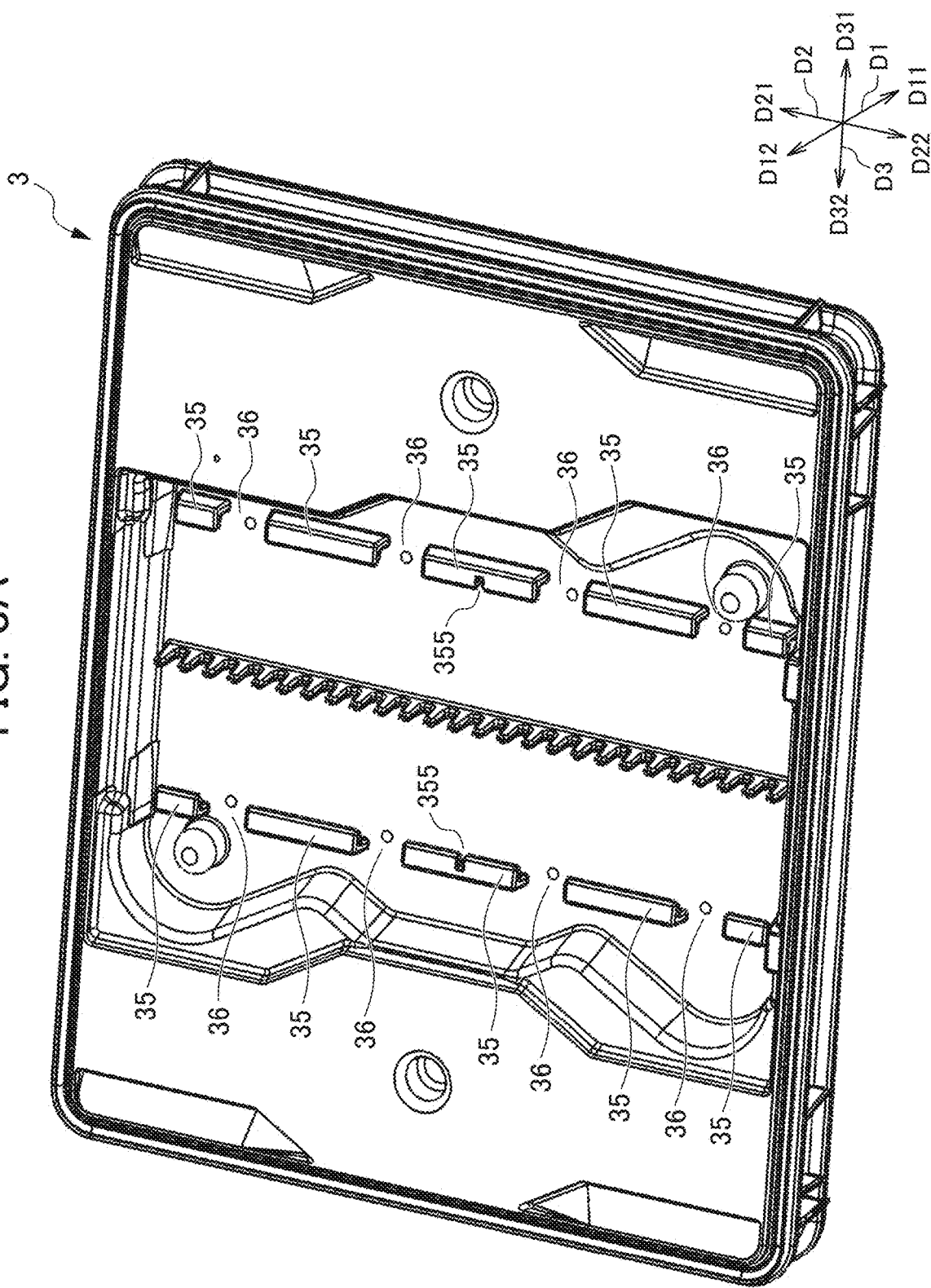
FIG. 3A is a perspective view of the lid body 3 according to the first embodiment of the present invention from which a front retainer 7 is removed, as seen from inside.

Hereinbelow, a substrate storing container according to a first embodiment of the present invention will be described with reference to FIGS. 1 to 6B. FIG. 1 is a perspective view illustrating a state where a lid body 3 is removed from a container main body 2 in a substrate storing container 1 according to the first embodiment of the present invention. FIG. 2A is a perspective view of the lid body 3 according to the first embodiment of the present invention as seen from inside. FIG. 2B is a back view of the lid body 3 according to the first embodiment of the present invention as seen from inside. FIG. 3A is a perspective view of the lid body 3 according to the first embodiment of the present invention from which a front retainer 7 is removed, as seen from inside.

Figure 4A:
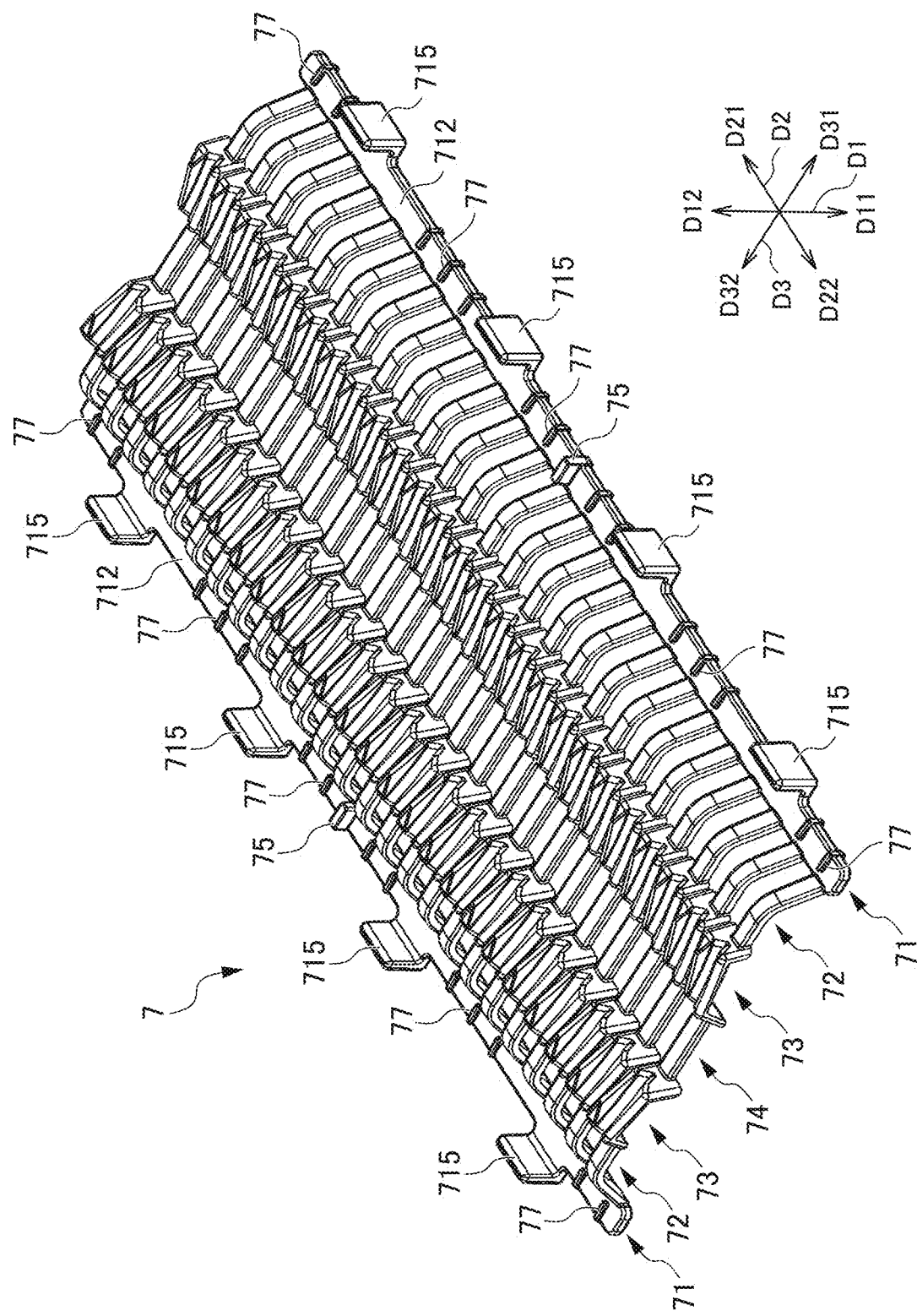
FIG. 4A is a perspective view of the front retainer 7 according to the first embodiment of the present invention as seen from inside (support side).
Figure 4B:
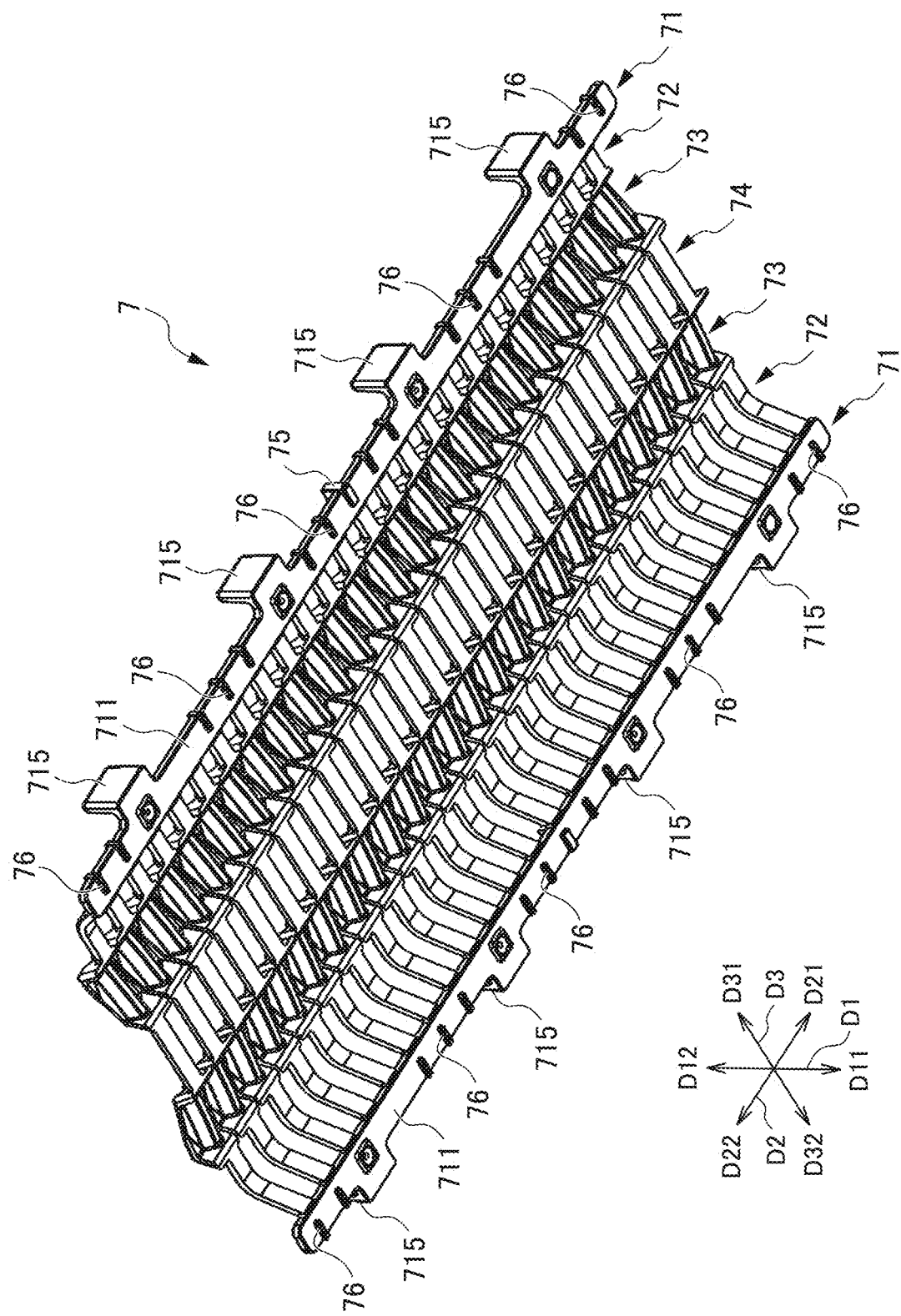
FIG. 4B is a perspective view of the front retainer 7 according to the first embodiment of the present invention as seen from outside.

FIG. 3B is a back view of the lid body 3 according to the first embodiment of the present invention from which the front retainer 7 is removed, as seen from inside. FIG. 4A is a perspective view of the front retainer 7 according to the first embodiment of the present invention as seen from inside (support side). FIG. 4B is a perspective view of the front retainer 7 according to the first embodiment of the present invention as seen from outside.

Figure 5A:
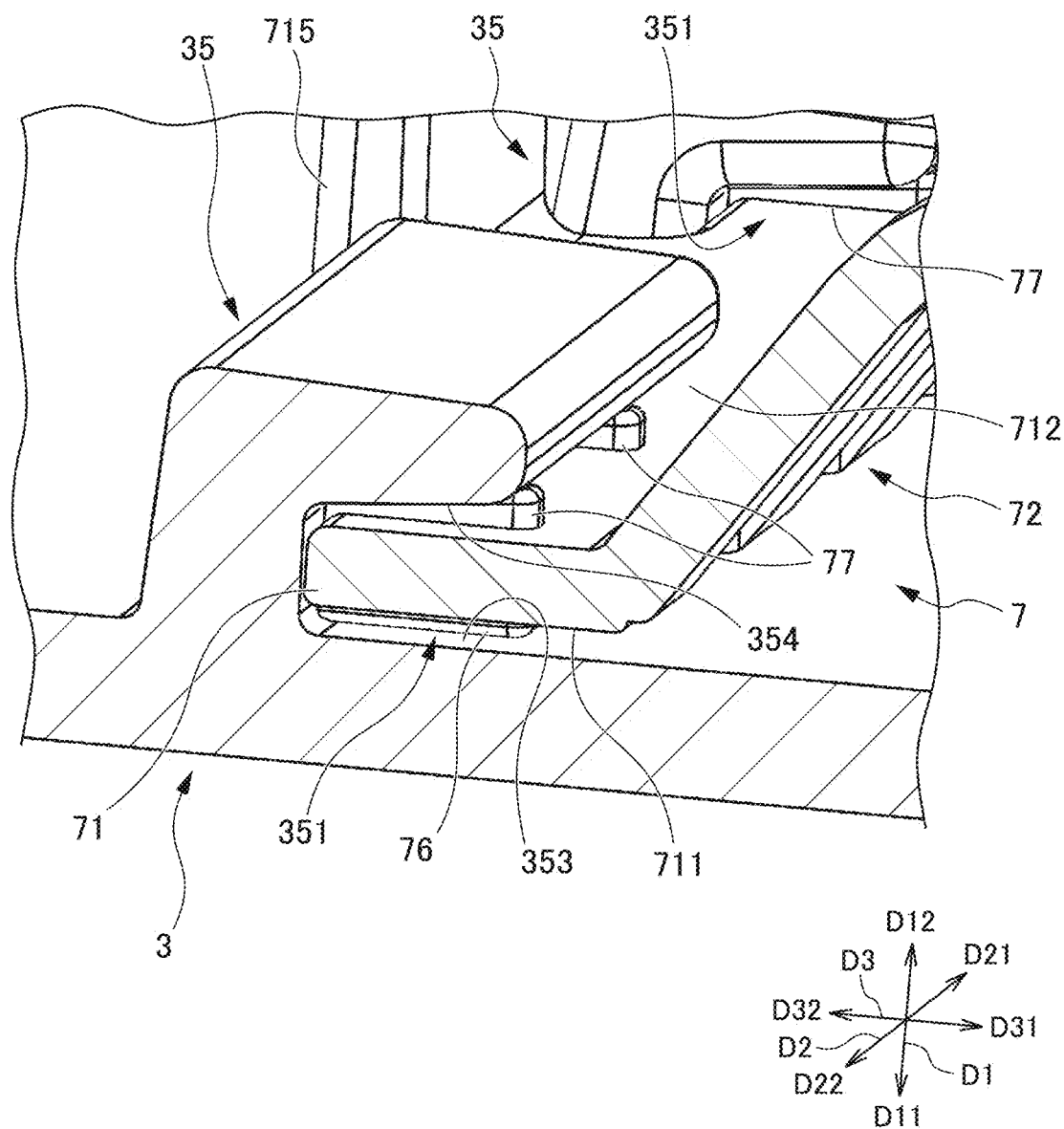
FIG. 5A is an enlarged cross-sectional perspective view of a part in which a frame portion 71 of the front retainer 7 is inserted into a frame portion retaining portion 35 of the lid body 3 in the substrate storing container 1 according to the first embodiment of the present invention.
Figure 5B:
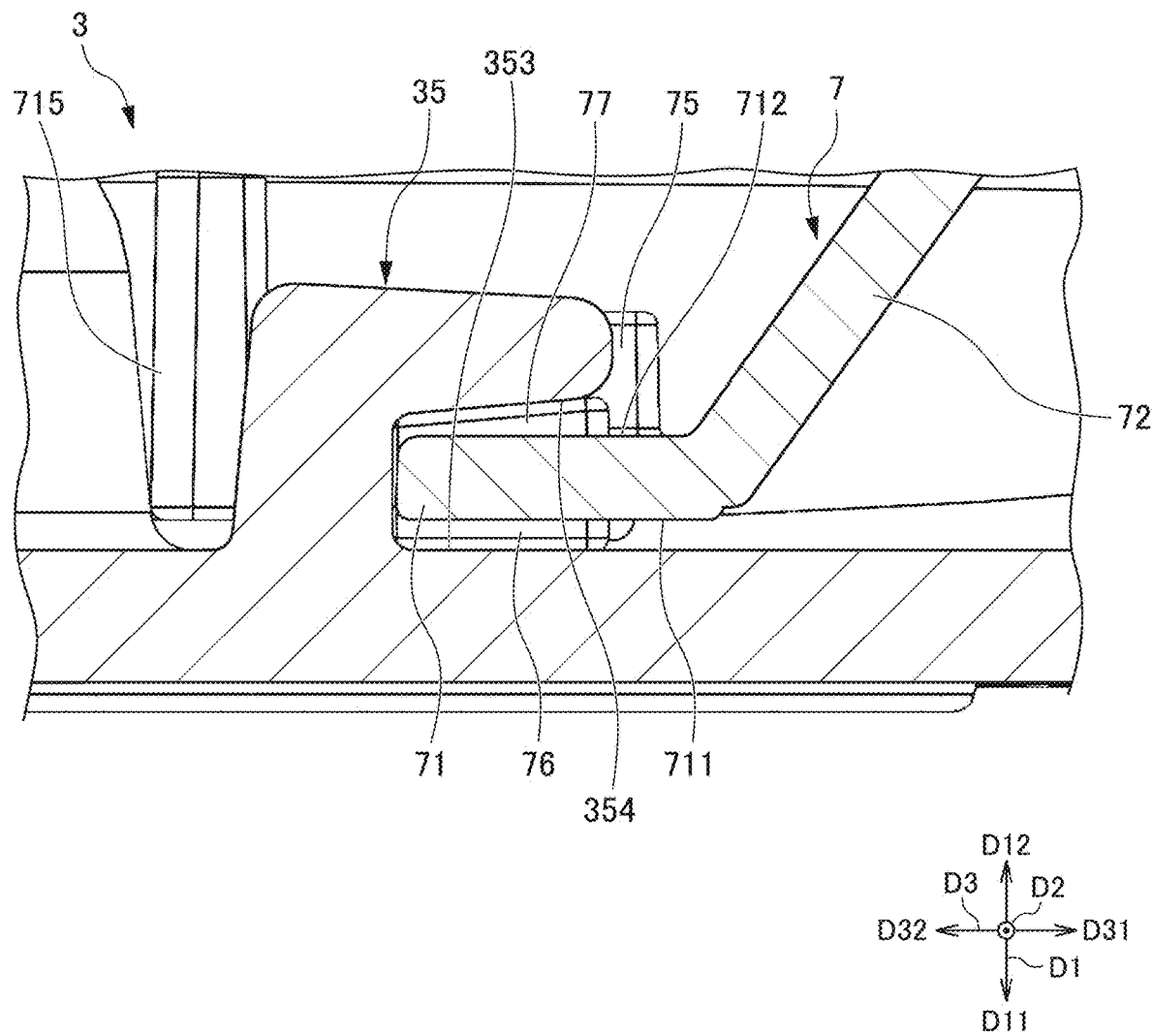
FIG. 5B is an enlarged cross-sectional view of the part in which the frame portion 71 of the front retainer 7 is inserted into the frame portion retaining portion 35 of the lid body 3 in the substrate storing container 1 according to the first embodiment of the present invention.
Figure 6A:
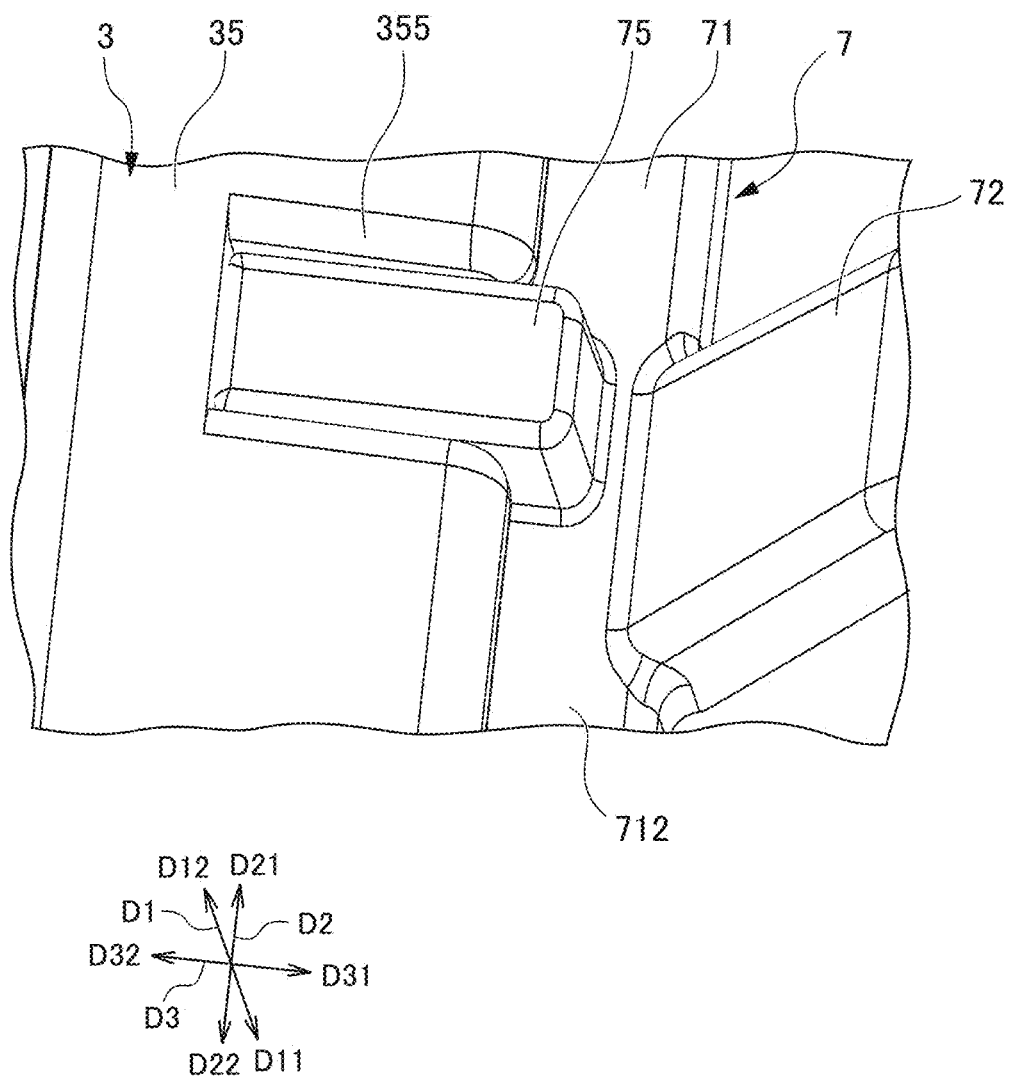
FIG. 6A is an enlarged perspective view of a part in which an engaging portion 75 of the front retainer 7 engages with the frame portion retaining portion 35 of the lid body 3 in the substrate storing container 1 according to the first embodiment of the present invention.

FIG. 5A is an enlarged cross-sectional perspective view of a part in which a frame portion 71 of the front retainer 7 is inserted into a frame portion retaining portion 35 of the lid body 3 in the substrate storing container 1 according to the first embodiment of the present invention. FIG. 5B is an enlarged cross-sectional view of the part in which the frame portion 71 of the front retainer 7 is inserted into the frame portion retaining portion 35 of the lid body 3 in the substrate storing container 1 according to the first embodiment of the present invention. FIG. 6A is an enlarged perspective view of a part in which an engaging portion 75 of the front retainer 7 engages with the frame portion retaining portion 35 of the lid body 3 in the substrate storing container 1 according to the first embodiment of the present invention. FIG. 6B is an enlarged back view of the part in which the engaging portion 75 of the front retainer 7 engages with the frame portion retaining portion 35 of the lid body 3 in the substrate storing container 1 according to the first embodiment of the present invention.

Herein, for the purpose of explanation, a direction (direction from upper right toward lower left in FIG. 1) from the container main body 2 (to be described later) toward the lid body 3 (to be described later) is defined as a forward direction D11, and a direction opposite thereto is defined as a backward direction D12. The directions are defined as a forward/backward direction D1. In addition, a direction (upper direction in FIG. 1) from a lower wall 24 (to be described later) toward an upper wall 23 (to be described later) is defined as an upper direction D21, and a direction opposite thereto is defined as a lower direction D22. The directions are defined as an upper/lower direction D2. In addition, a direction (direction from lower right toward upper left in FIG. 1) from a second side wall 26 (to be described later) toward a first side wall 25 (to be described later) is defined as a left direction D31, and a direction opposite thereto is defined as a right direction D32. The directions are defined as a left/right direction D3. Each drawing will be described with arrows indicating the directions.

In addition, a substrate W (refer to FIG. 1) stored in the substrate storing container 1 is a silicon wafer, a glass wafer, a sapphire wafer, or the like which has a disk shape, and is a thin wafer used in industrial applications. The substrate W in the present embodiment is a silicon wafer having a diameter of 300 mm.

As illustrated in FIG. 1, the substrate storing container 1 has a container main body 2; the lid body 3; the front retainer 7 (refer to FIG. 2A) as a lid body side substrate support portion; and a back side substrate support portion (not illustrated).

[Container Main Body]

As illustrated in FIGS. 1 and 2A, the container main body 2 has a tubular wall portion 20 in which a container main body opening portion 21 is formed in one end portion and the other end portion is closed. A substrate storing space 27 is formed inside the container main body 2. The substrate storing space 27 is formed by being surrounded by the wall portion 20. A substrate support plate-like portion 201 is disposed in a part of the wall portion 20, which forms the substrate storing space 27. As illustrated in FIG. 1, a plurality of the substrates W can be stored in the substrate storing space 27.

The substrate support plate-like portions 201 and 201 are provided in the wall portion 20 so as to form a pair in the substrate storing space 27 in the left/right direction D3. When the container main body opening portion 21 is not closed by the lid body 3, the substrate support plate-like portions 201 are capable of supporting edge portions of the plurality of substrates W in a state where the substrates W adjacent to each other are arranged parallel to each other while spaced apart by a predetermined interval from each other in the upper/lower direction D2. The back side substrate support portion (not illustrated) is provided on a back side of the substrate support plate-like portion 201. When the container main body opening portion 21 is closed by the lid body 3, the back side substrate support portion (not illustrated) is capable of supporting back portions of the edge portions of the plurality of substrates W.

The lid body 3 is removably attached to an opening circumferential portion 28 forming the container main body opening portion 21. The lid body 3 is capable of closing the container main body opening portion 21 in a positional relationship where the lid body 3 is surrounded by the opening circumferential portion 28, namely, in a state where the lid body 3 is fitted into the container main body opening portion 21 formed by the opening circumferential portion 28. The front retainer 7 (refer to FIG. 2A) is provided in a part of the lid body 3 which is opposite to the substrate storing space 27 when the container main body opening portion 21 is closed by the lid body 3, namely, on an inside (side facing the backward direction D12) of the lid body 3. The front retainer 7 (refer to FIG. 2A) is disposed so as to form a pair with the back side substrate support portion (not illustrated) in the substrate storing space 27 in the forward/backward direction D1.

When the container main body opening portion 21 is closed by the lid body 3, the front retainer 7 (refer to FIG. 2A) is capable of supporting front portions of the edge portions of the plurality of substrates W. When the container main body opening portion 21 is closed by the lid body 3, since the front retainer 7 supports the plurality of substrates W in cooperation with the back side substrate support portion (not illustrated), the front retainer 7 retains the plurality of substrates W in a state where the substrates W adjacent to each other are arranged parallel to each other while spaced apart by the predetermined interval from each other.

As illustrated in FIG. 1, the wall portion 20 of the container main body 2 has a back wall 22; the upper wall 23; the lower wall 24; the first side wall 25; and the second side wall 26. The back wall 22, the upper wall 23, the lower wall 24, the first side wall 25, and the second side wall 26 are made of a plastic material or the like, and in the first embodiment, are integrally formed by polycarbonate.

The first side wall 25 is opposite to the second side wall 26, and the upper wall 23 and the lower wall 24 are opposite to each other in the left/right direction D3. A back end of the upper wall 23, a back end of the lower wall 24, a back end of the first side wall 25, and a back end of the second side wall 26 are all connected to the back wall 22. A front end of the upper wall 23, a front end of the lower wall 24, a front end of the first side wall 25, and a front end of the second side wall 26 have a positional relationship where the front ends are opposite to the back wall 22, and form the opening circumferential portion 28 forming the container main body opening portion 21 having substantially a rectangular shape.

The opening circumferential portion 28 is provided in one end portion of the container main body 2, and the back wall 22 is positioned in the other end portion of the container main body 2. The profile of the container main body 2 formed by outer faces of the wall portion 20 is a box shape. Inner faces of the wall portion 20, namely, an inner face of the back wall 22, an inner face of the upper wall 23, an inner face of the lower wall 24, an inner face of the first side wall 25, and an inner face of the second side wall 26 form the substrate storing space 27 surrounded thereby. The container main body opening portion 21 formed in the opening circumferential portion 28 communicates with the substrate storing space 27 that is surrounded by the wall portion 20 and is formed inside the container main body 2. A maximum of 21 substrates W can be stored in the substrate storing space 27.

As illustrated in FIG. 1, a container main body leg portion 243 is provided on an outer face of the lower wall 24. The container main body leg portion 243 is integrally formed at both right and left end edges of the lower wall 24, and extends along both right and left end edges of the lower wall 24 in the forward/backward direction D1. When the container main body 2 is placed on a horizontal flat face with the lower wall 24 facing downward (facing the lower direction D22), the container main body leg portion 243 is in contact with the flat face, and stably supports the container main body 2.

[Lid Body and Front Retainer]

Hereinbelow, the lid body 3 and the front retainer 7 will be described in detail with reference to FIGS. 2A to 6B. As illustrated in FIGS. 2A to 6B, the front retainer 7 as the lid body side substrate support portion is fixed to the inside of the lid body 3. The front retainer 7 includes the frame portion 71 extending in the upper/lower direction D2; a retainer leg portion 72; and a lid body side substrate receiving portion 73. The frame portion 71, the retainer leg portion 72, and the lid body side substrate receiving portion 73 are integrally molded from resin, and are connected to each other.

The front retainer 7 has a shape illustrated in FIGS. 4A and 4B. Namely, in the frame portions 71, an end portion facing the left direction D31 and an end portion facing the right direction D32 extend in parallel to each other along the upper/lower direction D2. Each of the frame portion 71 facing the left direction D31 and the frame portion 71 facing the right direction D32 in the front retainer 7 has a projecting piece 715. A plurality of the projecting pieces 715 are provided extending outwards in the left/right direction D3, further projecting to the backward direction D12, and spaced apart from each other in the upper/lower direction D2.

The retainer leg portion 72 facing the left direction D31 extends from the frame portion 71 facing the left direction D31 toward right back in an overall view. Then, a tip end portion of the retainer leg portion 72 facing the left direction D31 is connected to an end portion of the lid body side substrate receiving portion 73 which faces the left direction D31. On the other hand, the retainer leg portion 72 facing the right direction D32 extends from the frame portion 71 facing the right direction D32 toward left back. Then, a tip end portion of the retainer leg portion 72 facing the right direction D32 is connected to an end portion of the lid body side substrate receiving portion 73 which faces the right direction D32. Therefore, the lid body side substrate receiving portion 73 is disposed at a position spaced a predetermined interval from an inner face of the lid body 3 in the backward direction D12.

The retainer leg portions 72 on both right and left sides are configured to be easily elastically deformed. For this reason, when the lid body side substrate receiving portion 73 receives an external force in a direction (forward direction D11) approaching the inner face of the lid body 3, the retainer leg portions 72 are elastically deformed in response to the external force to be able to displace the lid body side substrate receiving portion 73.

The lid body side substrate receiving portion 73 may be configured to continue from the end portion facing the left direction D31 connected to the tip end portion of the retainer leg portion 72 facing the left direction D31 to the end portion facing the right direction D32 connected to the tip end portion of the retainer leg portion 72 facing the right direction D32 (not illustrated). However, in the present embodiment, the lid body side substrate receiving portion 73 is divided into two pieces in a central part between the end portion facing the left direction D31 and the end portion facing the right direction D32. Namely, the lid body side substrate receiving portion 73 is divided into the lid body side substrate receiving portion 73 facing the left direction D31 and ranging from the end portion facing the left direction D31 to the vicinity of a center, and the lid body side substrate receiving portion 73 facing the right direction D32 and ranging from the end portion facing the right direction D32 to the vicinity of the center.

An end portion facing the right direction D32 in the lid body side substrate receiving portion 73 facing the left direction D31 is connected to an end portion facing the left direction D31 in the lid body side substrate receiving portion 73 facing the right direction D32 via a connecting portion 74. The connecting portion 74 extends in the left/right direction D3 in an overall view.

[Frame Portion Retaining Portion]

The frame portion retaining portion 35 of the lid body 3 retains the frame portion 71 of the front retainer 7 in a state where the frame portion 71 is inserted. In detail, the inner face (face facing the backward direction D12) of the lid body 3 is provided with the frame portion retaining portion 35 facing the left direction D31 which extends along the upper/lower direction D2 and is divided into a plurality of pieces (for example, three), and the frame portion retaining portion 35 facing the right direction D32 which extends along the upper/lower direction D2 and is divided into a plurality of pieces (for example, five). The frame portion retaining portion 35 facing the left direction D31 and the frame portion retaining portion 35 facing the right direction D32 are positioned equidistant from a virtual center line which penetrates a center of the lid body 3 in the left/right direction D3 and is aligned along the upper/lower direction D2, in a state where the virtual center line is interposed therebetween on both right and left sides.

As illustrated in FIGS. 2A to 3B, the frame portion retaining portion 35 facing the left direction D31 has an L-angled cross-section shape in which the frame portion retaining portion 35 extends slightly from the inner face of the lid body 3 to the backward direction D12 and extends from a tip end thereof to the right direction D32. Therefore, the frame portion retaining portion 35 facing the left direction D31 has a long groove 351 opening to the right direction D32 on the inner face of the lid body 3. The frame portion 71 of the front retainer 7 which faces the left direction D31 is inserted into the long groove 351 of the frame portion retaining portion 35 facing the left direction D31.

The frame portion retaining portion 35 facing the right direction D32 has an L-angled cross-section shape in which the frame portion retaining portion 35 extends slightly from the inner face of the lid body 3 to the backward direction D12 and extends from a tip end thereof to the left direction D31. Therefore, the frame portion retaining portion 35 facing the right direction D32 has the long groove 351 opening to the left direction D31 on the inner face of the lid body 3. The frame portion 71 of the front retainer 7 facing the right direction D32 is inserted into the long groove 351 of the frame portion retaining portion 35 facing the right direction D32.

A part not overlapping the frame portion retaining portion 35 on the same line as the line of the frame portion retaining portions 35 facing the left direction D31 and divided into a plurality of pieces (for example, five) becomes a notch portion 36. If the frame portion 71 is inserted into the long groove 351 of the frame portion retaining portion 35 such that the projecting piece 715 of the frame portion 71 of the front retainer 7 is disposed in the notch portion 36, the frame portion 71 of the front retainer 7 is retained on an inner face side of the lid body 3.

[Main Characteristics Part of Present Invention]

The front retainer 7 further includes a first convex portion 76, a second convex portion 77, and the engaging portion 75 in addition to the frame portion 71, the retainer leg portion 72, and the lid body side substrate receiving portion 73. The frame portion 71 and the frame portion retaining portion 35 of the lid body 3 have characteristic configurations (to be described in detail hereinbelow) in relation to the first convex portion 76, the second convex portion 77, and the engaging portion 75.

The frame portion 71 has a first face 711 facing the inner face side of the lid body 3, and a second face 712 which is a face opposite to the first face 711. Namely the first face 711 is a face of the frame portion 71 which faces the forward direction D11, and the second face 712 is a face of the frame portion 71 which faces the backward direction D12.

The frame portion retaining portion 35 has a third face 353 positioned face-to-face with the first face 711 of the front retainer 7 and a fourth face 354 positioned face-to-face with the second face 712 of the front retainer 7 in a state where the frame portion 71 is inserted (state where the frame portion 71 is inserted into the frame portion retaining portion 35). The face shapes of the first face 711, the second face 712, the third face 353, and the fourth face 354 are not limited, and may be, for example, a straight face, a quadric face, or a cubic face.

The front retainer 7 includes the first convex portion 76 projecting to the third face 353 on the first face 711 of the frame portion 71. The front retainer 7 includes the second convex portion 77 projecting to the fourth face 354 on the second face 712 of the frame portion 71. In the first embodiment, the first convex portion 76 and the second convex portion 77 extend along a planar direction D1-D3 (D1-D3 plane) of the substrate W. In detail, the extending direction of the first convex portion 76 and the second convex portion 77 is the left/right direction D3. A plurality of the first convex portions 76 and a plurality of the second convex portions 77 are arranged with an interval therebetween in the upper/lower direction D2, respectively. Each of the first convex portion 76 and the second convex portion 77 is provided at a position facing the frame portion retaining portion 35, and is not provided at a position corresponding to the notch portion 36.

A face of the first convex portion 76 which faces the forward direction D11 is facing the third face 353 of the frame portion retaining portion 35, and can be in contact with the third face 353 of the frame portion retaining portion 35. A face of the second convex portion 77 which faces the backward direction D12 is facing the fourth face 354 of the frame portion retaining portion 35, and can be in contact with the fourth face 354 of the frame portion retaining portion 35. On the other hand, since the first convex portion 76 is present, the first face 711 of the frame portion 71 is not in contact with the third face 353 of the frame portion retaining portion 35. Similarly, since the second convex portion 77 is present, the second face 712 of the frame portion 71 is not in contact with the fourth face 354 of the frame portion retaining portion 35.

The lid body side substrate support portion 7 includes the engaging portion 75 on the second face 712 of the frame portion 71. The engaging portion 75 engages with the frame portion retaining portion 35 in a state where the frame portion 71 is inserted. In detail, the engaging portion 75 serves as a key that projects to the backward direction D12 and extends outwards in the left/right direction D3. The frame portion retaining portion 35 includes an engaged part 355 that penetrates in the forward/backward direction D1 and opens to inside in the left/right direction D3. The engaged part 355 serves as a key groove that engages with the engaging portion 75 as a key. As described above, if the frame portion 71 is inserted into the long groove 351 of the frame portion retaining portion 35 such that the projecting piece 715 of the frame portion 71 of the front retainer 7 is disposed in the notch portion 36, the frame portion 71 of the front retainer 7 is retained on the inner face side of the lid body 3. However, if only this configuration is employed, rattling (particularly, rattling in the upper/lower direction D2) occurs between the lid body 3 and the front retainer 7. However, in the retained state, furthermore, the engaging portion 75 of the lid body side substrate support portion 7 engages with the engaged part 355 of the frame portion retaining portion 35. Therefore, rattling (particularly, rattling in the upper/lower direction D2) does not almost occur.

The substrate storing container 1 having the configuration described above is capable of operating as follows, and having the following effect. In the substrate storing container 1 of the first embodiment, the front retainer 7 includes the lid body side substrate receiving portion 73 that receives the edge portion of the substrate W when supporting the substrate W, and the frame portion 71 that is retained on the inner face side of the lid body 3 and has the first face 711 facing the inner face side of the lid body 3 and the second face 712 which is a face opposite to the first face 711. The lid body 3 includes the frame portion retaining portion 35 that retains the frame portion 71 in an inserted state and has the third face 353 opposite to the first face 711 and the fourth face 354 opposite to the second face 712. The lid body side substrate support portion 7 further includes the first convex portion 76 projecting to the third face 353 on the first face 711 of the frame portion 71, and the engaging portion 75 that engages with the frame portion retaining portion 35 on the second face 712 of the frame portion 71 in a state where the frame portion 71 is inserted.

For this reason, according to the first embodiment, in a state where the frame portion 71 is inserted, the first face 711 of the frame portion 71 is not in face contact with the third face 353 of the frame portion retaining portion 35. For this reason, a relatively large gap is formed between the first face 711 and the third face 353 (between the opposite faces), and thus a cleaning liquid (containing a rinsing liquid) infiltrates easily between the opposite faces, and the cleaning liquid escapes easily from between the opposite faces. In addition, compared to if the engaging portion 75 is provided on the second face 712 of the frame portion 71, if the engaging portion 75 is provided on the first face 711 of the frame portion 71, the cleaning liquid infiltrates more easily between the opposite faces, and the cleaning liquid escapes more easily from between the opposite faces. As a result, it is difficult for problems such as insufficient cleaning power, remaining cleaning liquid, and insufficient drying to occur between the opposite faces.

Second Embodiment

Figure 7A:
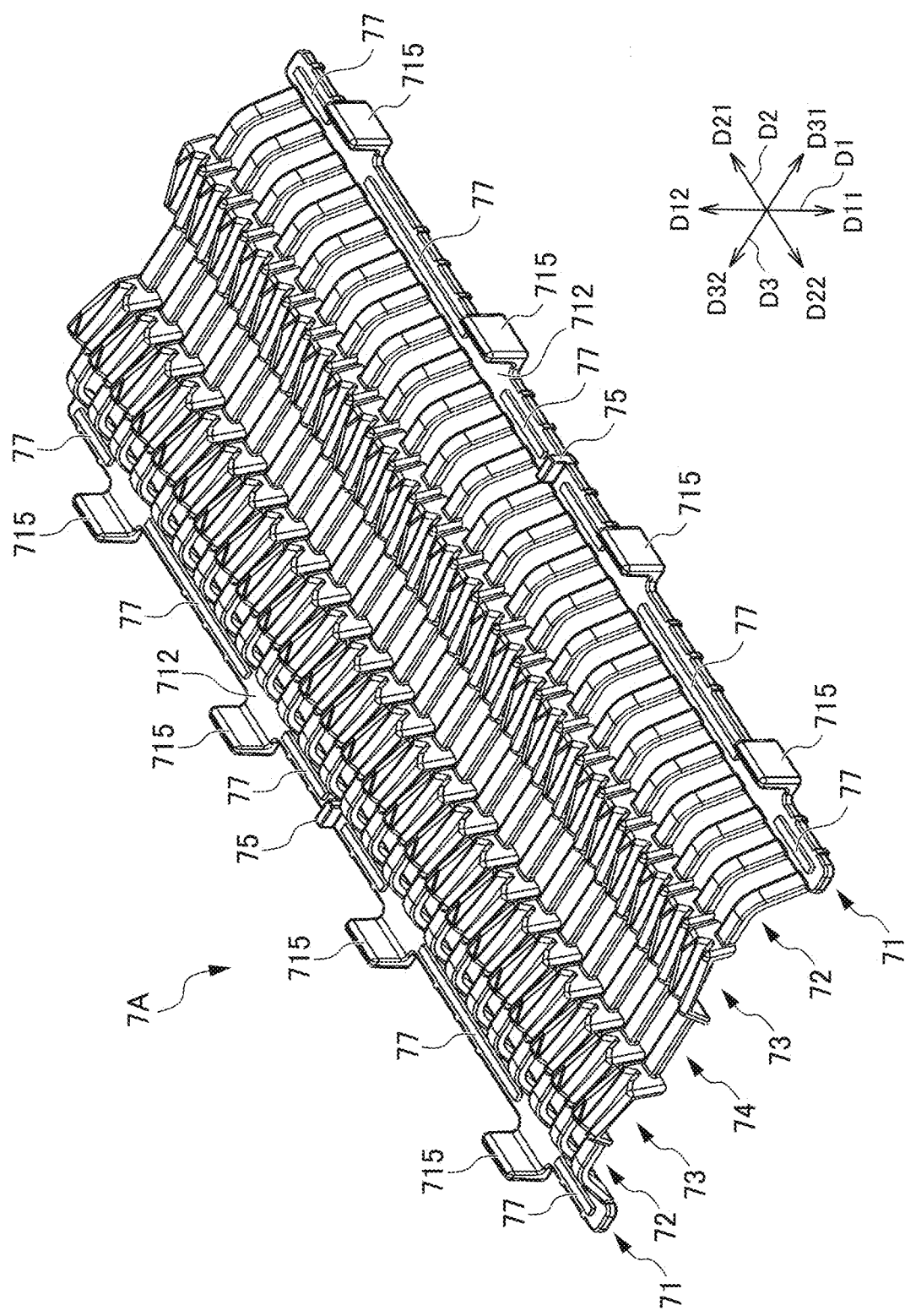
FIG. 7A is a perspective view (view corresponding to FIG. 4A) of a front retainer 7A according to a second embodiment of the present invention as seen from inside (support side).
Figure 7B:
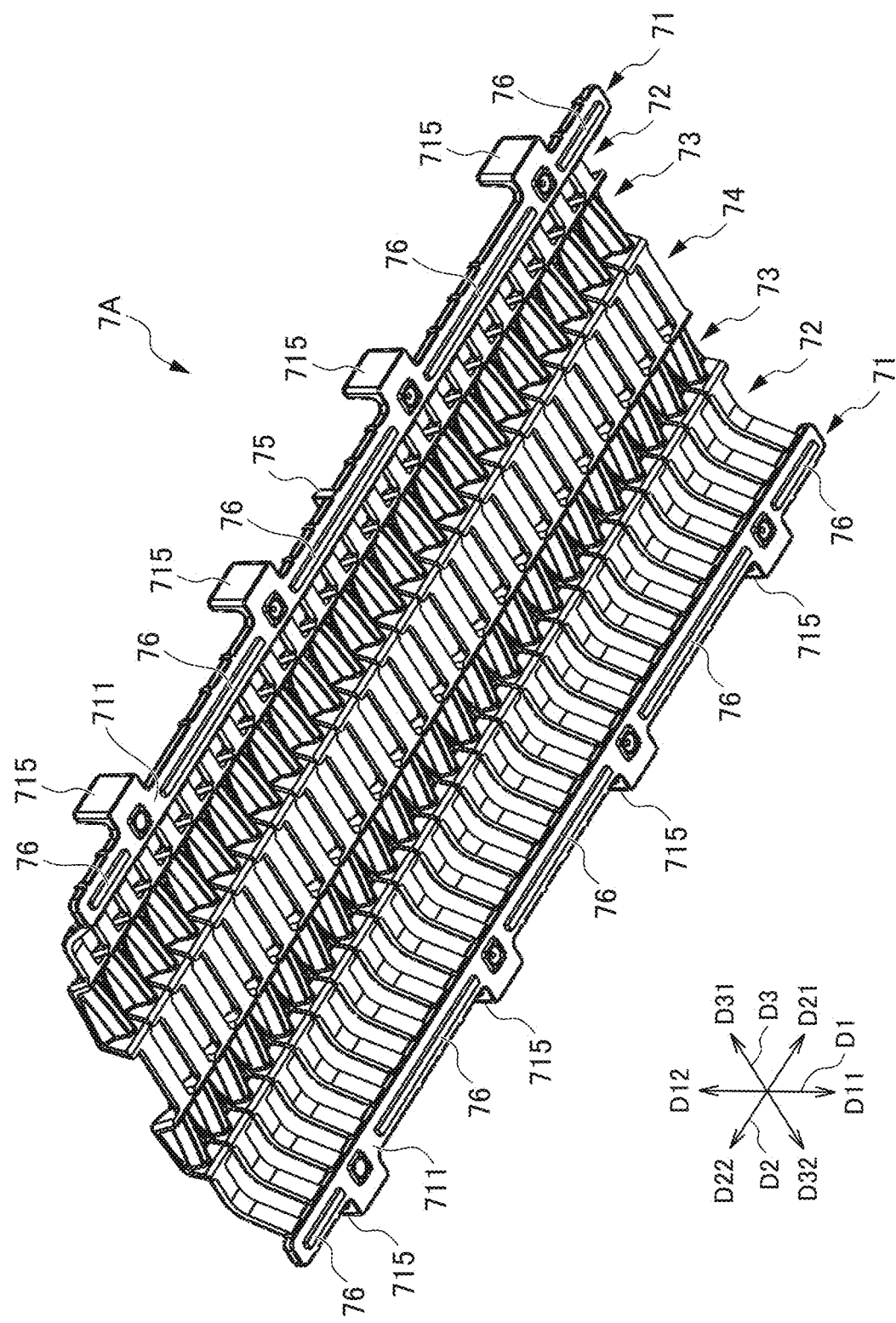
FIG. 7B is a perspective view (view corresponding to FIG. 4B) of the front retainer 7A according to the second embodiment of the present invention as seen from outside.
Figure 8:
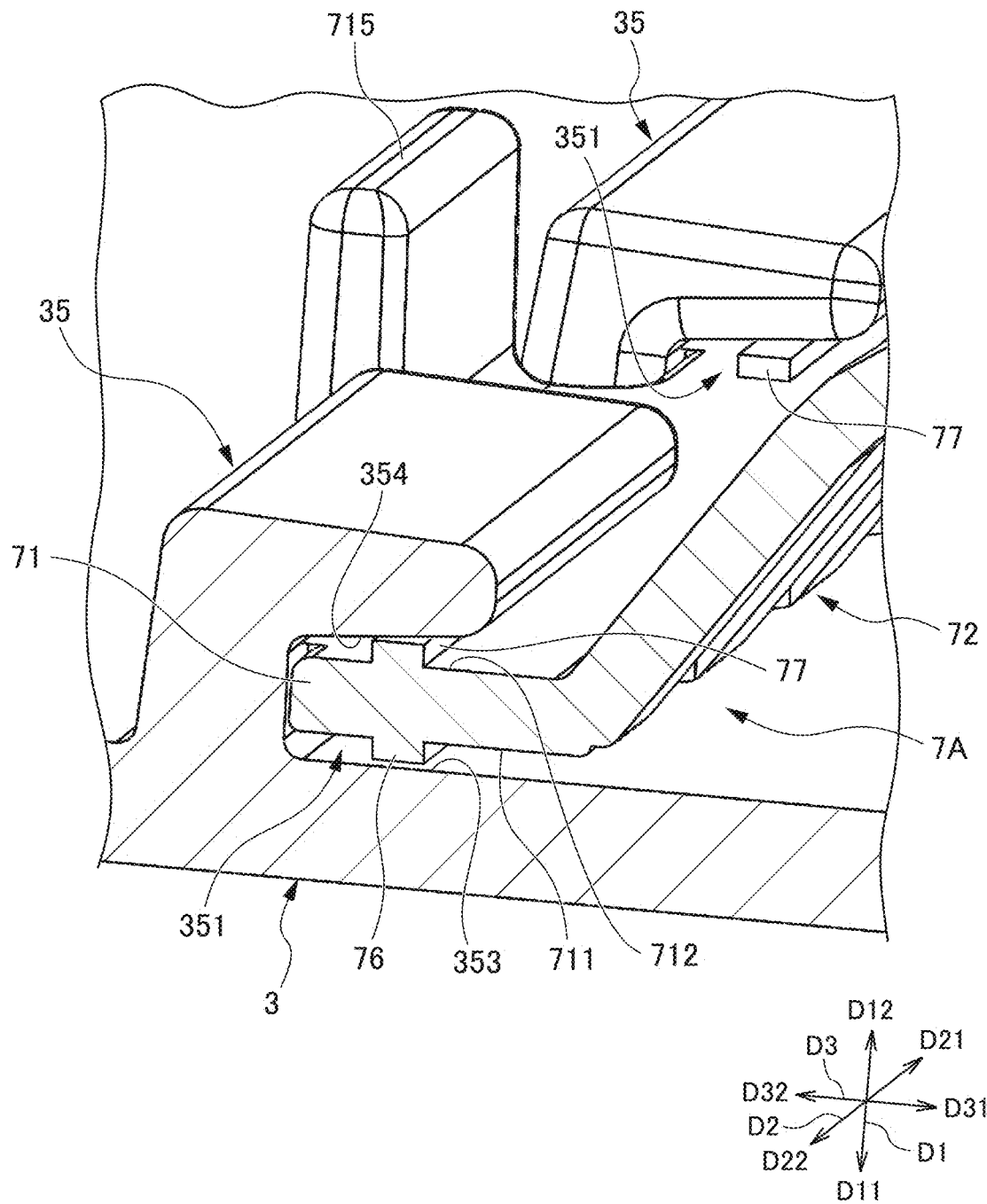
FIG. 8 is an enlarged cross-sectional perspective view (view corresponding to FIG. 5A) of a part in which the frame portion 71 of the front retainer 7A is inserted into the frame portion retaining portion 35 of the lid body 3 in a substrate storing container according to the second embodiment of the present invention.

Subsequently, a substrate storing container according to a second embodiment of the present invention will be described with reference to FIGS. 7A to 8. FIG. 7A is a perspective view (view corresponding to FIG. 4A) of a front retainer 7A according to the second embodiment of the present invention as seen from inside (support side). FIG. 7B is a perspective view (view corresponding to FIG. 4B) of the front retainer 7A according to the second embodiment of the present invention as seen from outside. FIG. 8 is an enlarged cross-sectional perspective view (view corresponding to FIG. 5A) of a part in which the frame portion 71 of the front retainer 7A is inserted into the frame portion retaining portion 35 of the lid body 3 in the substrate storing container according to the second embodiment of the present invention.

The substrate storing container according to the second embodiment differs from the substrate storing container 1 according to the first embodiment mainly in the shapes of the first convex portion and the second convex portion of the front retainer. Since other configurations are the same as the configurations of the first embodiment, the description thereof will be omitted. The same configuration signs will be described with the same reference signs assigned thereto.

In the front retainer 7 according to the first embodiment, the first convex portion 76 and the second convex portion 77 extend along the planar direction (D1-D3 plane) of the substrate W. In contrast, as illustrated in FIGS. 7A to 8, in the front retainer 7A according to the second embodiment, the first convex portion 76 and the second convex portion 77 extend along an arrangement direction (the upper/lower direction D2) of a plurality of the substrates W. Each of the first convex portion 76 and the second convex portion 77 is provided at a position facing the frame portion retaining portion 35, and is not provided at a position corresponding to the notch portion 36.

It should be noted that in the second embodiment, only one first convex portion 76 and only one second convex portion 77 are provided in the left/right direction D3, but the present invention is not limited thereto, and a plurality of the first convex portions 76 and a plurality of the second convex portions 77 may be provided in the left/right direction D3.

The second embodiment is capable of having the following effect in addition to the effect of the first embodiment. In the second embodiment, the first convex portion 76 and the second convex portion 77 extend along the arrangement direction (upper/lower direction D2) of the plurality of substrates W. For this reason, in a state where the frame portion 71 is inserted, it is difficult for the first convex portion 76 and the second convex portion 77 to restrict the flow of the cleaning liquid between the first face 711 and the third face 353 (between the opposite faces) and between the second face 712 and the fourth face 354 (between the opposite faces) in the upper/lower direction D2 (which is a direction where the long groove 351 of the frame portion retaining portion 35 extends). Therefore, there is attained a further improvement in the effect that "it is difficult for problems such as insufficient cleaning power, remaining cleaning liquid, and insufficient drying to occur".

Third Embodiment

Figure 9A:
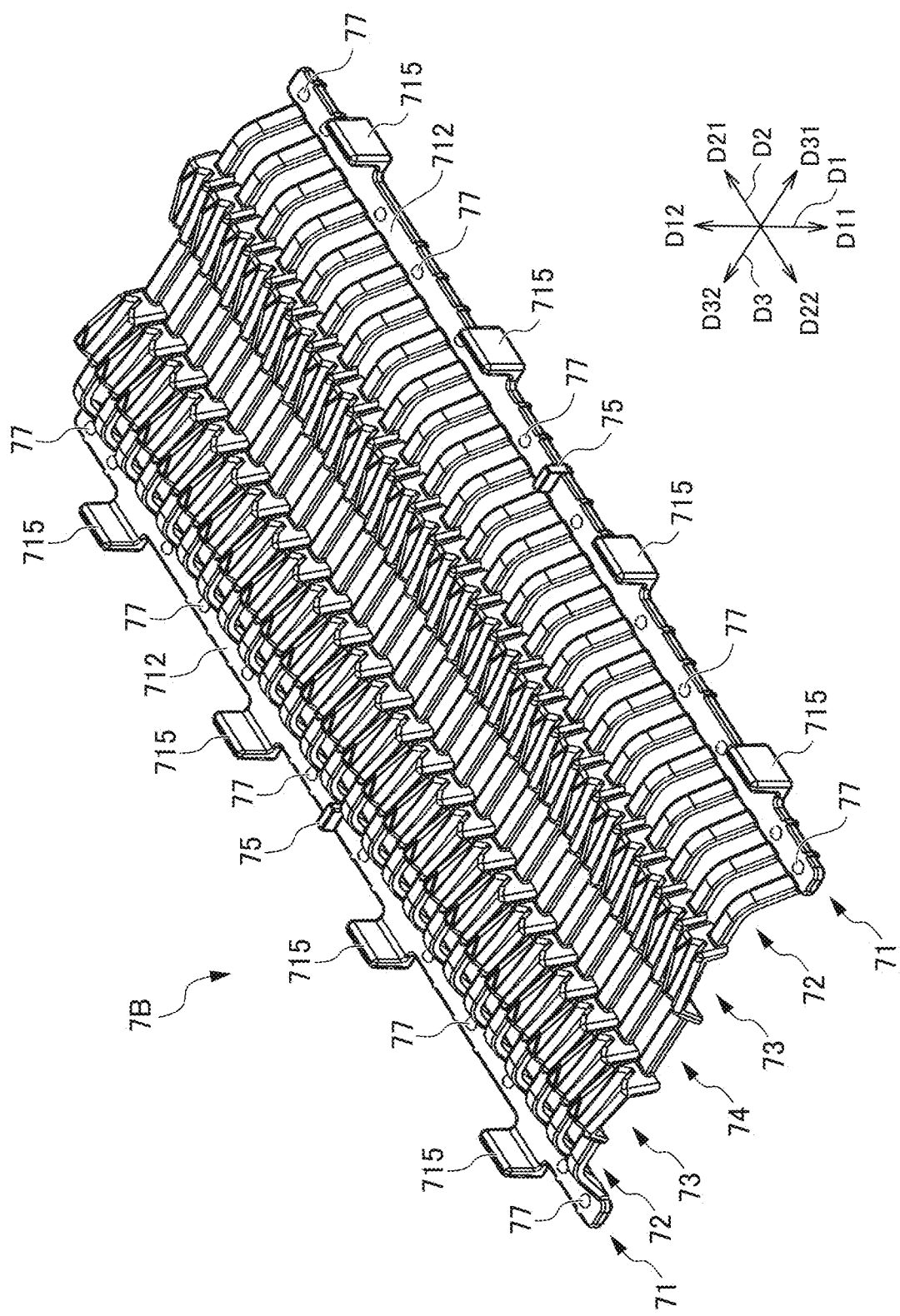
FIG. 9A is a perspective view (view corresponding to FIG. 4A) of a front retainer 7B according to a third embodiment of the present invention as seen from inside (support side).
Figure 9B:
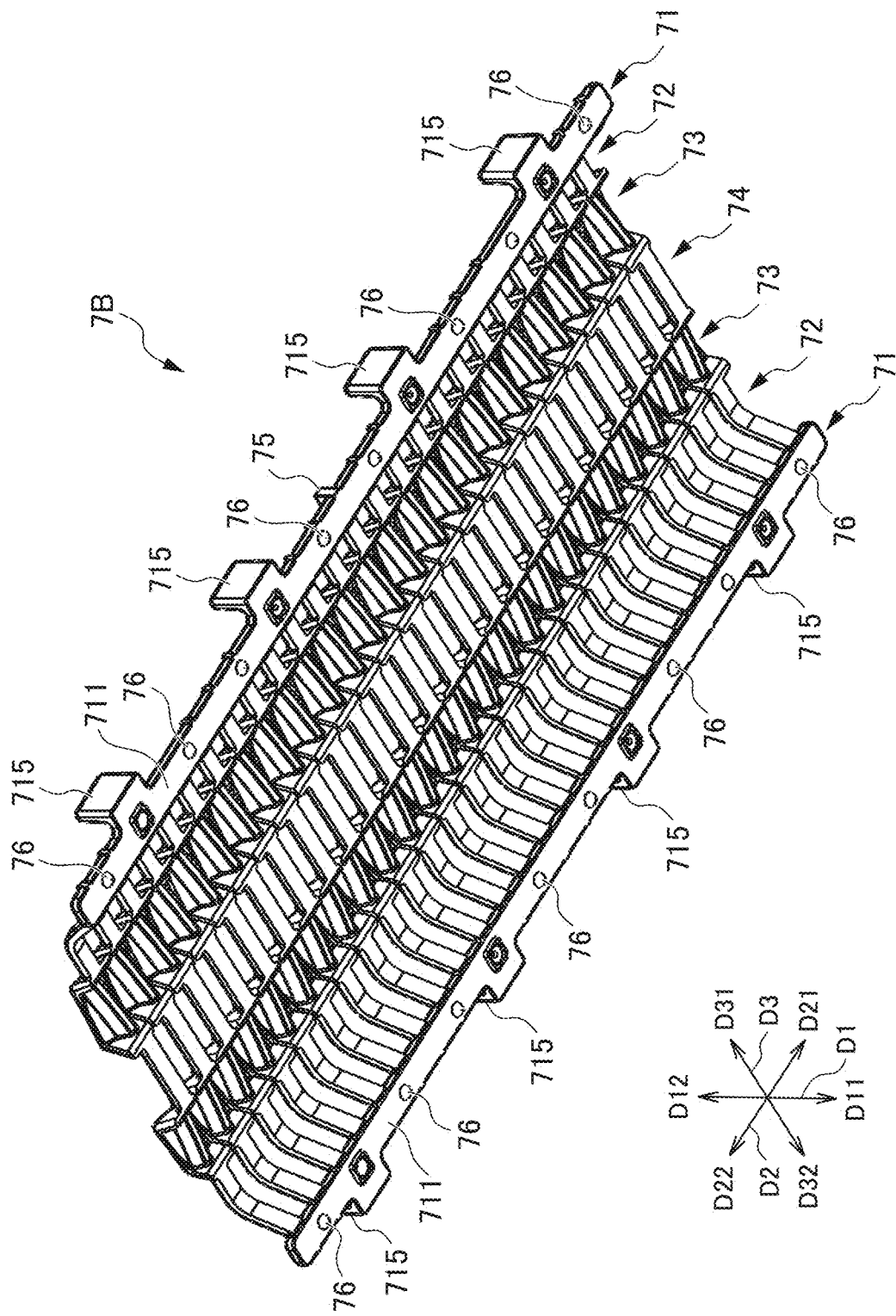
FIG. 9B is a perspective view (view corresponding to FIG. 4B) of the front retainer 7B according to the third embodiment of the present invention as seen from outside.
Figure 10:
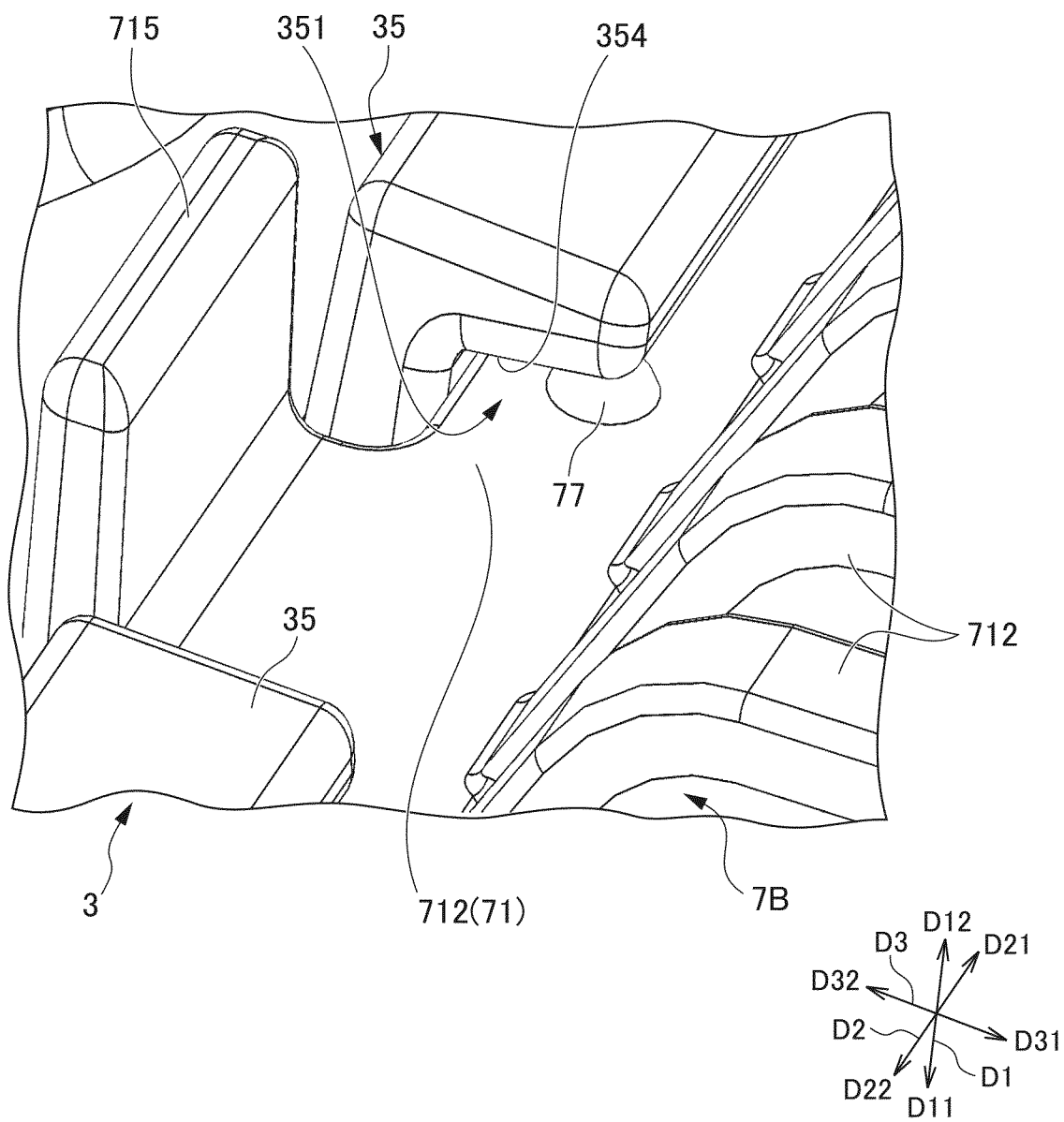
FIG. 10 is an enlarged cross-sectional perspective view (view corresponding to FIG. 5A) of a part in which the frame portion 71 of the front retainer 7B is inserted into the frame portion retaining portion 35 of the lid body 3 in a substrate storing container according to the third embodiment of the present invention.

Subsequently, a substrate storing container according to a third embodiment of the present invention will be described with reference to FIGS. 9A to 10. FIG. 9A is a perspective view (view corresponding to FIG. 4A) of a front retainer 7B according to the third embodiment of the present invention as seen from inside (support side). FIG. 9B is a perspective view (view corresponding to FIG. 4B) of the front retainer 7B according to the third embodiment of the present invention as seen from outside. FIG. 10 is an enlarged cross-sectional perspective view (view corresponding to FIG. 5A) of a part in which the frame portion 71 of the front retainer 7B is inserted into the frame portion retaining portion 35 of the lid body 3 in the substrate storing container according to the third embodiment of the present invention.

The substrate storing container according to the third embodiment differs from the substrate storing container according to the second embodiment mainly in the shapes of the first convex portion and the second convex portion of the front retainer. Since other configurations are the same as the configurations of the second embodiment, the description thereof will be omitted. The same configuration signs will be described with the same reference signs assigned thereto.

As illustrated in FIGS. 9A to 10, in the front retainer 7B according to the third embodiment, the first convex portion 76 and the second convex portion 77 have a shape in which the first convex portion 76 and the second convex portion 77 can be in point contact with the third face 353 and the fourth face 354 opposite thereto, respectively. Examples of the shape in which point contact is enabled include, for example, a cubic surface shape bulging out toward the third face 353 or the fourth face 354, or a polyhedral shape having a vertex on the third face 353 or the fourth face 354 and formed of a plurality of planes. Each of the first convex portion 76 and the second convex portion 77 is provided at a position facing the frame portion retaining portion 35, and is not provided at a position corresponding to the notch portion 36.

It should be noted that in the third embodiment, a plurality of the first convex portions 76 and a plurality of the second convex portions 77 are disposed on straight lines extending in the upper/lower direction D2, respectively, and are arranged with an interval therebetween in the upper/lower direction D2, but the present invention is not limited thereto. The first convex portions 76 and the second convex portions 77 can be disposed in a random pattern, for example, may be arranged in a zig-zag pattern along the upper/lower direction D2.

The third embodiment is capable of having the following effect in addition to the effect of the second embodiment. In the third embodiment, the first convex portion 76 and the second convex portion 77 have a shape in which the first convex portion 76 and the second convex portion 77 can be in point contact with the third face 353 and the fourth face 354 opposite thereto, respectively. For this reason, in a state where the frame portion 71 is inserted, it is difficult for the first convex portion 76 and the second convex portion 77 to restrict the flow of the cleaning liquid between the first face 711 and the third face 353 (between the opposite faces) and between the second face 712 and the fourth face 354 (between the opposite faces) in the upper/lower direction D2 and the left/right direction D3. Therefore, there is attained a further improvement in the effect that "it is difficult for problems such as insufficient cleaning power, remaining cleaning liquid, and insufficient drying to occur".

The present invention is not limited to the abovementioned embodiments, and various modifications can be made without departing the technical scope described in the claims. The second convex portion 77 may not be provided. It is possible to appropriately combine together the configurations of the embodiments. In addition, the shapes of the container main body and the lid body and the number of sheets and the dimensions of the substrates which can be stored in the container main body are not limited to the shapes of the container main body 2 and the lid body 3, the number of sheets, and the dimensions in the present embodiments.

EXPLANATION OF REFERENCE NUMERALS

1 SUBSTRATE STORING CONTAINER
2 CONTAINER MAIN BODY
3 LID BODY
7 FRONT RETAINER (LID BODY SIDE SUBSTRATE SUPPORT PORTION)
20 WALL PORTION
21 CONTAINER MAIN BODY OPENING PORTION
27 SUBSTRATE STORING SPACE
28 OPENING CIRCUMFERENTIAL PORTION
35 FRAME PORTION RETAINING PORTION
71 FRAME PORTION
73 LID BODY SIDE SUBSTRATE RECEIVING PORTION
75 ENGAGING PORTION
76 FIRST CONVEX PORTION
77 SECOND CONVEX PORTION
353 THIRD FACE
354 FOURTH FACE
711 FIRST FACE
712 SECOND FACE
D1-D3 PLANAR DIRECTION

D2 UPPER/LOWER DIRECTION (ARRANGEMENT DIRECTION)
W SUBSTRATE

The invention claimed is:

1. A substrate storing container comprising:
a container main body which includes a tubular wall portion which has an opening circumferential portion in which a container main body opening portion is formed in one end portion and in which another end portion is closed, and in which a substrate storing space capable of storing a plurality of substrates and communicating with the container main body opening portion is formed by an inner face of the wall portion;
a lid body removably attached to the container main body opening portion and capable of closing the container main body opening portion;
a lid body side substrate support portion disposed in a part of the lid body facing the substrate storing space, and capable of supporting edge portions of the plurality of substrates when the container main body opening portion is closed by the lid body; and
a back side substrate support portion disposed so as to form a pair with the lid body side substrate support portion in the substrate storing space, capable of supporting edge portions of the plurality of substrates, and capable of supporting the plurality of substrates in cooperation with the lid body side substrate support portion when the container main body opening portion is closed by the lid body,
wherein the lid body side substrate support portion includes a lid body side substrate receiving portion which receives the edge portion of the substrate when supporting the substrate, and a frame portion retained on an inner face side of the lid body and having a first face facing the inner face side of the lid body and a second face which is a face opposite to the first face,
wherein the lid body includes a frame portion retaining portion which retains the frame portion in an inserted state, and has a third face facing the first face and a fourth face facing the second face, and
wherein the lid body side substrate support portion further includes a first convex portion projecting to the third face on the first face side of the frame portion, and an engaging portion which engages with the frame portion retaining portion on the second face side of the frame portion in a state where the frame portion is inserted and the first face of the frame portion is not face contact with the third face of the frame portion retaining portion.

2. The substrate storing container according to claim 1, wherein the lid body side substrate support portion further includes a second convex portion projecting to the fourth face on the second face of the frame portion.

3. The substrate storing container according to claim 2, wherein the first convex portion and/or the second convex portion extend along a planar direction of the substrate.

* * * * *